(12) United States Patent
He et al.

(10) Patent No.: US 7,736,790 B2
(45) Date of Patent: Jun. 15, 2010

(54) PLATINUM AND TUNGSTEN CONTAINING ELECTROCATALYSTS

(75) Inventors: Ting He, Dublin, OH (US); Eric Rolland Kreidler, Pickerington, OH (US)

(73) Assignee: Honda Motor Co., Ltd., Tokyo (JP)

( * ) Notice: Subject to any disclaimer, the term of this patent is extended or adjusted under 35 U.S.C. 154(b) by 446 days.

(21) Appl. No.: 11/294,465

(22) Filed: Dec. 6, 2005

(65) Prior Publication Data

US 2006/0141335 A1 Jun. 29, 2006

Related U.S. Application Data

(63) Continuation-in-part of application No. 11/004,235, filed on Dec. 6, 2004.

(51) Int. Cl.
  *H01M 4/92* (2006.01)
(52) U.S. Cl. .................. 429/40; 502/182; 502/183; 502/313; 502/314
(58) Field of Classification Search .............. 429/40; 502/182, 183, 313, 314
  See application file for complete search history.

(56) References Cited

U.S. PATENT DOCUMENTS

| | | |
|---|---|---|
| 3,506,494 A | 4/1970 | Adlhart |
| 3,645,860 A | 2/1972 | Fishman et al. |
| 3,856,876 A | 12/1974 | Burnett |
| 4,126,934 A | 11/1978 | Richter et al. |
| 4,186,110 A | 1/1980 | Jalan et al. |
| 4,192,907 A | 3/1980 | Jalan et al. |
| 4,232,097 A | 11/1980 | Shanks et al. |
| 4,311,569 A | 1/1982 | Dempsey et al. |
| 4,457,824 A | 7/1984 | Dempsey et al. |

(Continued)

FOREIGN PATENT DOCUMENTS

EP 0 827 225 A2 3/1998

(Continued)

OTHER PUBLICATIONS

Gotz, M., et al.; "Binary and ternary anode catalyst formulations including the elements W, Sn and Mo for PEMFCs operated on methanol or reformate gas," Electrochimica Acta, vol. 43, No. 24, pp. 3637-3644 (1998), Elsevier Science, Ltd.

(Continued)

Primary Examiner—Jane Rhee
(74) Attorney, Agent, or Firm—Capitol City TechLaw, PLLC; Mark E. Duell

(57) ABSTRACT

The present teachings are directed toward electrocatalyst compositions of platinum, tungsten and at least a third metal for use in fuel cells. The electrocatalyst composition is composed essentially of platinum present in an atomic percentage ranging between about 20 percent and about 55 percent, tungsten present in an atomic percentage ranging between about 30 percent and about 75 percent, and at least a third metal present in an atomic percentage ranging between about 1 percent and about 40 percent. The third metal can be at least one member selected from the group consisting of scandium, vanadium, chromium, manganese, iron, cobalt, copper, zinc, yttrium, niobium, molybdenum, cadmium, tin, hafnium, tantalum and rhenium; additional fourth and fifth metals can also be present.

17 Claims, 2 Drawing Sheets

U.S. PATENT DOCUMENTS

| | | | |
|---|---|---|---|
| 4,513,094 A | 4/1985 | Luczak | |
| 4,528,083 A | 7/1985 | LaConti et al. | |
| 4,705,610 A | 11/1987 | Tenhover et al. | |
| 4,707,229 A | 11/1987 | Dempsey et al. | |
| 4,746,584 A | 5/1988 | Tenhover et al. | |
| 4,781,803 A | 11/1988 | Harris et al. | |
| 4,826,795 A | 5/1989 | Kitson et al. | |
| 4,937,220 A | 6/1990 | Nickols, Jr. | |
| 5,068,161 A | 11/1991 | Keck et al. | |
| 5,298,343 A | 3/1994 | Savadogo et al. | |
| 5,922,488 A | 7/1999 | Marucchi-Soos et al. | |
| 2001/0027160 A1 | 10/2001 | Lee et al. | |
| 2003/0059666 A1* | 3/2003 | Kourtakis | 429/40 |
| 2004/0013601 A1 | 1/2004 | Butz et al. | |
| 2004/0072061 A1 | 4/2004 | Nakano et al. | |
| 2004/0121219 A1 | 6/2004 | Mei et al. | |
| 2004/0142230 A1* | 7/2004 | Katori et al. | 429/42 |
| 2005/0037920 A1 | 2/2005 | Devenney et al. | |
| 2005/0147867 A1 | 7/2005 | Cooper et al. | |
| 2007/0037039 A1 | 2/2007 | Chondroudis et al. | |
| 2008/0032885 A1* | 2/2008 | Uchida et al. | 502/101 |

FOREIGN PATENT DOCUMENTS

| | | |
|---|---|---|
| GB | 2242203 | 9/1991 |
| WO | WO 03/071621 A2 | 8/2003 |
| WO | WO 03/081702 A2 | 10/2003 |
| WO | WO 03/083963 A2 | 10/2003 |
| WO | WO 2004/109829 A1 | 12/2004 |
| WO | WO 2007/024489 A2 | 3/2007 |

OTHER PUBLICATIONS

Arico, A.S., et al.; "Investigation of a carbon-supported quaternary Pt-Ru-Sn-W catalyst for direct methanol fuel cells," J. Power Sources, vol. 55, pp. 159-166 (1995); Elsevier Science S.A.

* cited by examiner

US 7,736,790 B2

PLATINUM AND TUNGSTEN CONTAINING ELECTROCATALYSTS

CROSS-REFERENCE TO RELATED APPLICATIONS

The present application claims benefit from and is a continuation-in-part of earlier filed U.S. patent application Ser. No. 11/004,235, filed Dec. 6, 2004, which is incorporated herein in its entirety by reference for all purposes.

BACKGROUND

1. Field of the Invention

The present teachings relate to electrocatalyst compositions composed essentially of platinum, tungsten and a third metal, with platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The third metal is at least one member selected from the group consisting of scandium, vanadium, chromium, manganese, iron, cobalt, copper, zinc, yttrium, niobium, molybdenum, cadmium, tin, hafnium, tantalum and rhenium. The electrocatalyst compositions can also include a fourth metal and a fifth metal in atomic percentages ranging between about 1 percent and about 40 percent, wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

2. Discussion of the Related Art

The desire to reduce the amount of expensive platinum group metals needed to obtain a desired level of performance for an electrocatalyst is an ever present operational parameter for the design of many devices and procedures involving electrocatalysts.

Enhancement of catalytic performance by combining platinum with various less expensive metals is one of the possible avenues to either reduce the amount of platinum required, or perhaps increase the efficiency of the catalyzed reaction, or both. One application of interest for Pt-based electrocatalyst is, for instance, the cathode reaction of a typical proton exchange membrane fuel cell ("PEMFC") which can utilize an electrode containing a Pt-based electrocatalyst to catalyze the oxygen reduction reaction.

A need exists for electrocatalyst compositions that reduce the amount of platinum needed to achieve a desired performance level.

SUMMARY

The present teachings satisfy the need for electrocatalyst compositions with lower platinum amounts, particularly for fuel cell electrocatalysts.

An electrocatalyst composition including a metal composition composed essentially of platinum, tungsten and a third metal is taught by the present disclosure. The composition can contain platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The third metal is at least one member selected from the group consisting of scandium, vanadium, chromium, manganese, iron, cobalt, copper, zinc, yttrium, niobium, molybdenum, cadmium, tin, hafnium, tantalum and rhenium. The electrocatalyst compositions can also include a fourth and a fifth metal in atomic percentages ranging between about 1 percent and about 40 percent, and wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

A fuel cell electrocatalyst comprising a composition containing essentially platinum, tungsten, a third metal, and, optionally, a fourth metal or fifth metal is also taught by the present disclosure. Again, the composition can contain platinum present in an atomic percentage ranging between about 20 percent and about 55 percent, tungsten present in an atomic percentage ranging between about 30 percent and about 75 percent, a third metal present in an atomic percentage ranging between about 1 percent and about 40 percent, and a fourth metal or fifth metal, if present, can be present in an atomic percentage ranging between about 1 percent and about 40 percent.

The present teachings further include a fuel cell assembly comprising at least one thin film electrocatalyst, a membrane, and at least one electrode. The thin film electrocatalyst comprises a composition composed essentially of platinum, tungsten, a third metal, and possibly, a fourth metal or fifth metal, with platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The fourth and fifth metals, if present, can be present in an atomic percentage ranging between about 1 percent and about 40 percent. The thin film electrocatalyst can also be a supported electrocatalyst which can comprise a powder composition composed essentially of platinum, tungsten and any additional metals supported on a high surface area support material. The electrocatalyst can be a supported nanoparticle-containing powder.

The third metals referred to in the compositions and electrocatalysts taught in the present application can be at least one member selected from the group consisting of scandium, vanadium, chromium, manganese, iron, cobalt, copper, zinc, yttrium, niobium, molybdenum, cadmium, tin, hafnium, tantalum and rhenium. The fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium. In some embodiments of the compositions and electrocatalysts taught in the present application, the third metal can be cobalt, and fourth metal can be at least one member selected from the group consisting of nickel, zirconium, chromium, copper, molybdenum, tin and titanium.

BRIEF DESCRIPTION OF THE FIGURES

The accompanying figures, which are included to provide a further understanding of the present teachings and are incorporated in and constitute a part of this specification, illustrate results obtained by various embodiments of the present teachings and together with the detailed description serve to explain the principles of the present teachings. In the figures.

DETAILED DESCRIPTION

Figure 1:
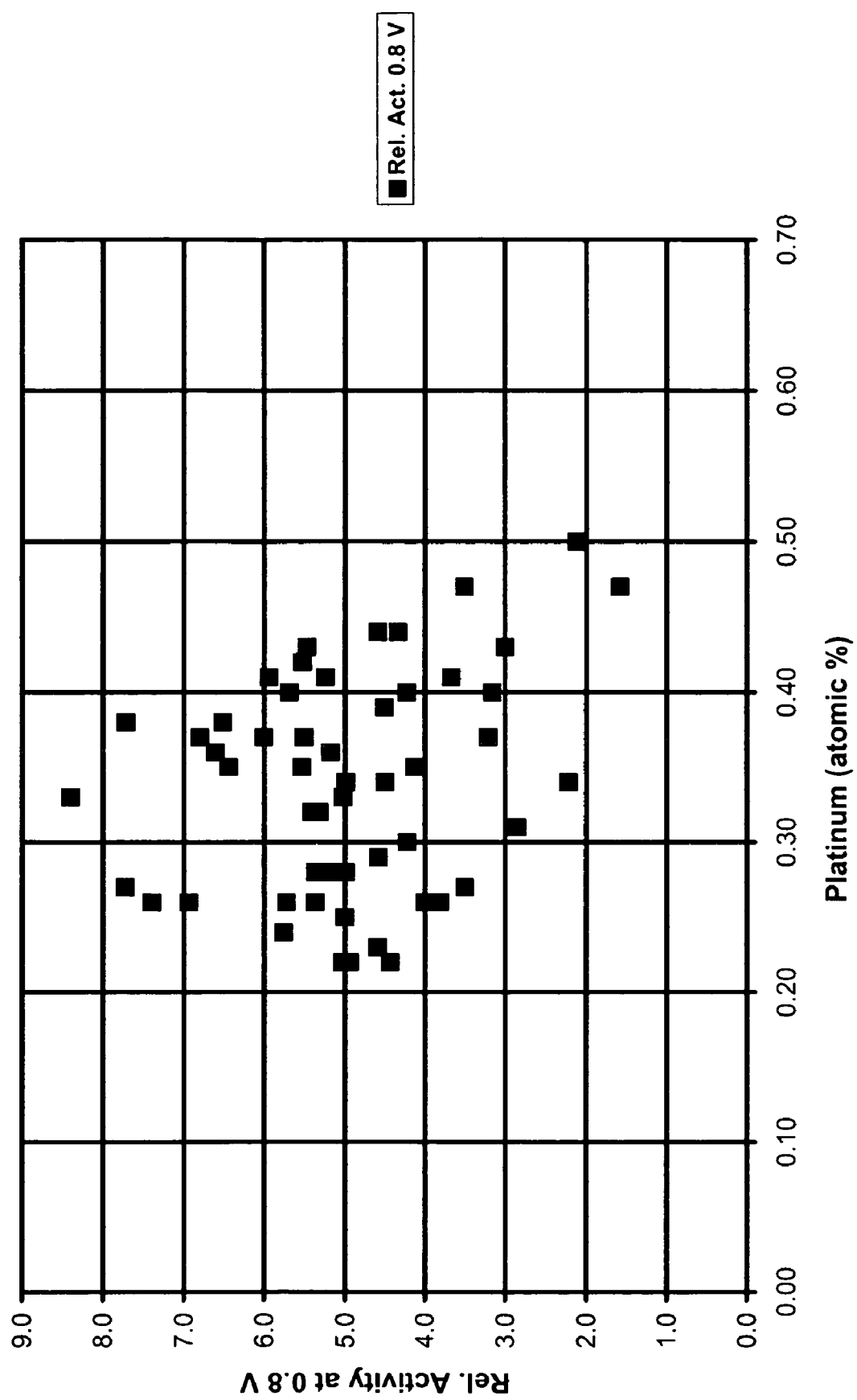
FIG. 1 is a graph of the platinum mass-fraction-based activities at 0.8 V for the oxygen reduction reaction relative to a standard platinum electrocatalyst for platinum, tungsten, a third metal and, in some instances, a fourth metal-containing electrocatalysts at various atomic percentages of platinum.

The present teachings relate to an electrocatalyst composition including a metal composition composed essentially of platinum, tungsten and a third metal. The composition can contain platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The third metal is at least one member selected from the group consisting of scandium, vanadium, chromium, manganese, iron, cobalt, copper, zinc, yttrium, niobium, molybdenum, cadmium, tin, hafnium, tantalum and rhenium. The electrocatalyst compositions can also include a fourth and a fifth metal in atomic percentages ranging between about 1 percent and about 40 percent, and wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

The third and any additional metals referred to in the compositions and electrocatalysts taught in the present application can be at least one member selected from the group consisting of scandium, vanadium, chromium, manganese, iron, cobalt, copper, zinc, yttrium, niobium, molybdenum, cadmium, tin, hafnium, tantalum and rhenium. In some embodiments of the compositions and electrocatalysts taught in the present application, the third metal can be cobalt, and fourth metal can be at least one member selected from the group consisting of nickel, zirconium, chromium, copper, molybdenum, tin and titanium.

In additional embodiments of the compositions and electrocatalysts taught in the present application, the third metal can be at least one member selected from the group consisting of chromium, copper, molybdenum and tin. There can also be a fourth metal present in the electrocatalyst composition, different from the third metal, and can be at least one member selected from the group consisting of nickel, zirconium, chromium, copper, molybdenum, tin and titanium.

The metals in the electrocatalyst composition can be present in any of several possible oxidation states and structures. The metal oxidation state and structure depend on a number of factors, including, for example, the chemical formulation, heat treatment, and any exposure to hydrogen and/or oxygen-containing environments. The possible metal structures can include, for example, alloys, mixed oxides, hydrous oxides, mixed hydrides, bronzes, pervoskites, and so forth. The structure of any metals on the surface of the electrocatalyst can differ from, or can be the same as, the structure of metals located within the bulk of the electrocatalyst. The concentration of any metals on the surface of the electrocatalyst can differ from, or can be the same as, the concentration of metals located within the bulk of the electrocatalyst.

The metal components of the composition can be present at or on the surface of the electrocatalyst. The metal components, both oxidized and metallic, can be located anywhere in the structure of an electrocatalyst composition according to the present teachings.

Also provided by the present teachings is a fuel cell electrocatalyst composed from an electrocatalyst composition, where the composition is composed essentially of platinum present in an atomic percentage ranging between about 20 percent and about 55 percent, tungsten present in an atomic percentage ranging between about 30 percent and about 75 percent, and a third metal present in an atomic percentage ranging between about 1 percent and about 40 percent. The third metal is at least one member selected from the group consisting of scandium, vanadium, chromium, manganese, iron, cobalt, copper, zinc, yttrium, niobium, molybdenum, cadmium, tin, hafnium, tantalum and rhenium. The composition can also include a fourth and a fifth metal in atomic percentages ranging between about 1 percent and about 40 percent, and wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

The fuel cell electrocatalyst can be a supported nanoparticle-containing powder. The nanoparticles present in the supported powder can range in size from about 0.5 nm to about 100 nm, and can be composed of a composition composed essentially of platinum, tungsten, and a third metal. The nanoparticle powder composition can be composed of platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The third metal can be at least one member selected from the group consisting of scandium, vanadium, chromium, manganese, iron, cobalt, copper, zinc, yttrium, niobium, molybdenum, cadmium, tin, hafnium, tantalum and rhenium. The nanoparticle powder composition can also include a fourth and a fifth metal in atomic percentages ranging between about 1 percent and about 40 percent, and wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

The fuel cell electrocatalyst can be in various forms, including, for example, a thin film, a supported powder, or a supported nanoparticle-containing powder. The thin film fuel cell electrocatalyst can be supported on a support, such as a high surface area carbon, or can be unsupported.

The thin film fuel cell electrocatalyst can be prepared by, for example, physical vapor deposition. The physical vapor can be plasma generated by a suitable means, for example, plasma guns. Further examples of deposition methods include, for instance, ion plating, ion implantation, evaporation, and laser surface alloying.

The thin film fuel cell electrocatalyst can be prepared by, for example, simultaneous deposition of the platinum metal, the tungsten metal, the third metal, and any fourth metal, if present. Alternatively, the thin film fuel cell electrocatalyst can be prepared by sequential deposition of the various metals, or by various combinations of simultaneous and sequential deposition of the various metals present in the electrocatalyst composition.

A fuel cell assembly including a membrane, a thin film, or supported, electrocatalyst, and an electrode which can be different from the thin film electrocatalyst is provided. The thin film, or supported, electrocatalyst can be composed of a composition composed essentially of platinum, tungsten, and a third metal. The composition can have platinum present in an atomic percentage ranging between about 20 percent and about 55 percent, tungsten present in an atomic percentage ranging between about 30 percent and about 75 percent, and the third metal present in an atomic percentage ranging between about 1 percent and about 40 percent. The third metal can be at least one member selected from the group consisting of scandium, vanadium, chromium, manganese, iron, cobalt, copper, zinc, yttrium, niobium, molybdenum, cadmium, tin, hafnium, tantalum and rhenium. The composition can also include a fourth and a fifth metal in atomic percentages ranging between about 1 percent and about 40 percent, and wherein the fourth and fifth metals are, independently, at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium.

The supported electrocatalyst can be composed of a powder composition. The powder composition can be prepared by any suitable preparation method, for instance, wet chemical methods. The powder can be supported on a suitable high surface area support. The high surface area support can be, for instance, carbon or alumina. High surface area refers to supports with surface areas of at least about 100 $m^2/g$.

For all of the compositions taught herein, the concentrations of the metals present therein can be varied to optimize the performance of the electrocatalyst. The composition can be varied dependent on such factors as the operating environment and performance requirements. The composition can, in some embodiments, include platinum present in an atomic percentage ranging between about 20 percent and about 45 percent, or in an atomic percentage ranging between about 30 percent and about 40 percent.

Additionally, the composition can, in some embodiments, include tungsten present in an atomic percentage ranging between about 30 percent and about 65 percent, or in an atomic percentage ranging between about 60 percent and about 70 percent. Furthermore, the composition can, in some embodiments, include molybdenum present in an atomic percentage ranging between about 1 percent and about 25 percent, or in an atomic percentage ranging between about 5 percent and about 20 percent, or in an atomic percentage ranging between about 10 percent and about 15 percent. Additionally, the composition can, in some embodiments, include copper present in an atomic percentage ranging between about 5 percent and about 30 percent, or in an atomic percentage ranging between about 10 percent and about 20 percent.

The composition can, in some embodiments, include chromium present in an atomic percentage ranging between about 1 percent and about 15 percent, or in an atomic percentage ranging between about 5 percent and about 10 percent. In other embodiments, the composition can include tin present in an atomic percentage ranging between about 1 percent and about 15 percent, or in an atomic percentage ranging between about 5 percent and about 10 percent.

Combinations of chromium and molybdenum in the composition can be present in an atomic percentage totaling in a range between about 10 percent and about 30 percent, or in a range of between about 15 percent and about 25 percent.

In one possible application of the present teachings, the cathode of a PEMFC can be composed of the electrocatalyst composition taught herein, and can drive the oxygen reduction reaction of the PEMFC. The presently disclosed compositions, when utilized as electrocatalyst, can exhibit activity for the oxygen reduction reaction at least about twice as active as a standard platinum only electrocatalyst.

A thin film can be a film ranging in thickness from nanometers to micrometers thick and can be prepared by physical vapor deposition, electrochemical plating, or ink coating of the desired components onto a suitable substrate. One possible means of producing the desired thin film is physical vapor deposition. Physical vapor deposition refers to the deposition of the components from component vapors generated through, for instance, heat, plasma, and electron beams. The deposition of the components, in this case, platinum, tungsten and additional metals, can occur simultaneously, which is referred to as co-deposition, or sequentially. A suitable preparation method is described in pending U.S. patent application Ser. No. 10/757,302 filed Jan. 14, 2004.

All publications, articles, papers, patents, patent publications, and other references cited herein are hereby incorporated herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The following examples are presented to provide a more complete understanding of the present teachings. The specific techniques, conditions, materials, and reported data set forth to illustrate the principles of the present teachings are exemplary and should not be construed as limiting the scope of the present teachings.

Examples

Thin film samples of varying platinum, tungsten and additional metals composition were prepared by physical vapor deposition of plasma generated metal vapors. A suitable preparation method is described in pending U.S. patent application Ser. No. 10/757,302 filed Jan. 14, 2004.

The activity levels for the oxygen reduction reaction of the platinum, tungsten and additional metal-containing electrocatalysts were electrochemically screened using a hydrodynamic rotating disc electrode (RDE) apparatus, which is capable of screening numerous material compositions simultaneously. A suitable screening method is described in pending U.S. patent application Ser. No. 10/713,242 filed Nov. 14, 2003.

Figure 2:
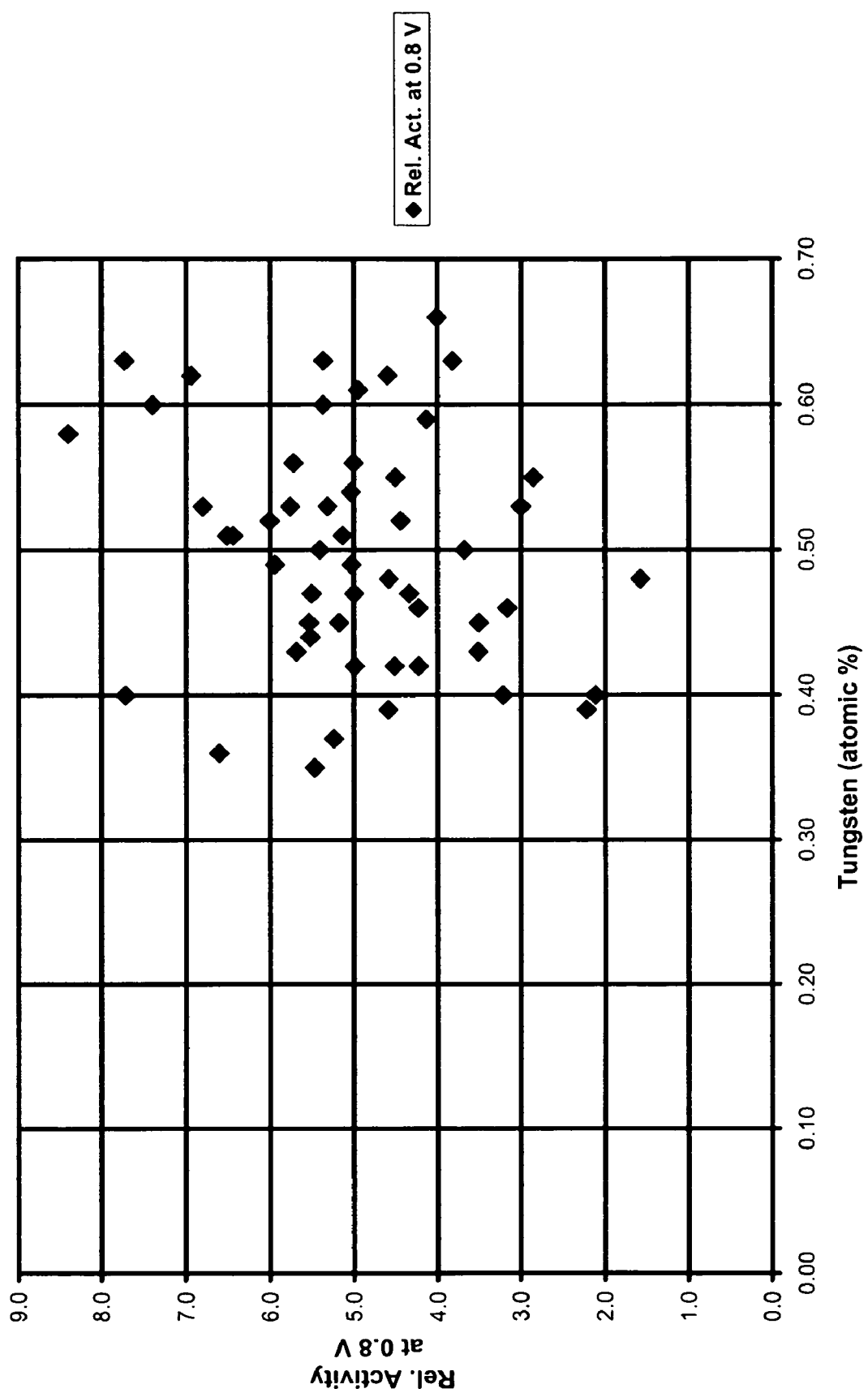
FIG. 2 is a graph of the platinum mass-fraction-based activities at 0.8 V for the oxygen reduction reaction relative to a standard platinum electrocatalyst for platinum, tungsten, a third metal and, in some instances, a fourth metal-containing electrocatalysts at various atomic percentages of tungsten.

Thin film samples were coated onto 5 mm diameter glassy carbon electrodes. Following electrochemical cleaning, the samples were then used as the working electrodes in oxygen reduction reaction cells, and the results are presented in Table 1 below and FIGS. 1 and 2.

In Table 1, the atomic percentages of the platinum, tungsten, third and fourth metal components are tabulated. The shifts of half wave potential ($\Delta E_{1/2}$) in mV are presented, along with the platinum mass-fraction-based activity relative to pure platinum thin film (R-Act) at both 0.7 V and 0.8 V for each sample, in Table 1. The platinum mass-fraction-based activities at various levels of platinum and tungsten concentrations relative to pure platinum thin film at 0.8 V are presented in FIGS. 1 and 2, respectively.

TABLE 1

| COMPOSITION | | | | | | | R- | R- |
|---|---|---|---|---|---|---|---|---|
| Pt (at | W (at | Cu (at | Cr (at | Mo (at | Sn (at | ?E | Act (0.7 | Act (0.8 |

TABLE 1-continued

| %) | %) | %) | %) | %) | %) | (mV) | V) | V) |
|---|---|---|---|---|---|---|---|---|
| 0.22 | 0.54 | 0.23 | | | | 19.5 | 4.6 | 5.0 |
| 0.22 | 0.61 | 0.17 | | | | 13.2 | 4.4 | 4.9 |
| 0.26 | 0.63 | 0.11 | | | | 7.3 | 3.4 | 3.8 |
| 0.26 | 0.66 | 0.08 | | | | 10.6 | 3.8 | 4.0 |
| 0.28 | 0.47 | 0.25 | | | | 31.7 | 5.0 | 5.0 |
| 0.30 | 0.42 | 0.28 | | | | 26.1 | 3.7 | 4.2 |
| 0.33 | 0.49 | 0.18 | | | | 36.6 | 5.0 | 5.0 |
| 0.34 | 0.55 | 0.11 | | | | 30.0 | 4.5 | 4.5 |
| 0.35 | 0.59 | 0.06 | | | | 26.6 | 4.2 | 4.1 |
| 0.36 | 0.36 | 0.28 | | | | 54.7 | 6.0 | 6.6 |
| 0.37 | 0.47 | 0.16 | | | | 44.9 | 5.6 | 5.5 |
| 0.38 | 0.40 | 0.22 | | | | 62.1 | 7.3 | 7.7 |
| 0.40 | 0.43 | 0.17 | | | | 50.6 | 6.2 | 5.7 |
| 0.41 | 0.49 | 0.09 | | | | 51.1 | 6.4 | 5.9 |
| 0.23 | 0.62 | | 0.15 | | | 22.6 | 6.5 | 4.6 |
| 0.27 | 0.63 | | 0.09 | | | 47.5 | 8.5 | 7.7 |
| 0.31 | 0.55 | | 0.14 | | | 18.0 | 4.5 | 2.9 |
| 0.33 | 0.58 | | 0.09 | | | 59.8 | 10.1 | 8.4 |
| 0.40 | 0.46 | | 0.13 | | | 25.3 | 3.8 | 3.2 |
| 0.26 | 0.56 | | | 0.18 | | 28.7 | 5.5 | 5.7 |
| 0.26 | 0.60 | | | 0.13 | | 42.0 | 6.9 | 7.4 |
| 0.26 | 0.62 | | | 0.11 | | 38.7 | 6.9 | 6.9 |
| 0.28 | 0.51 | | | 0.21 | | 30.5 | 4.9 | 5.1 |
| 0.32 | 0.53 | | | 0.15 | | 35.9 | 5.1 | 5.3 |
| 0.34 | 0.42 | | | 0.23 | | 39.0 | 4.6 | 5.0 |
| 0.35 | 0.45 | | | 0.20 | | 42.8 | 5.4 | 5.5 |
| 0.36 | 0.45 | | | 0.18 | | 40.3 | 5.0 | 5.2 |
| 0.37 | 0.52 | | | 0.11 | | 47.5 | 6.0 | 6.0 |
| 0.38 | 0.51 | | | 0.11 | | 52.1 | 6.4 | 6.5 |
| 0.41 | 0.37 | | | 0.22 | | 47.5 | 5.3 | 5.2 |
| 0.42 | 0.44 | | | 0.13 | | 50.5 | 5.9 | 5.5 |
| 0.43 | 0.35 | | | 0.22 | | 52.7 | 5.8 | 5.5 |
| 0.44 | 0.39 | | | 0.17 | | 45.0 | 5.0 | 4.6 |
| 0.44 | 0.47 | | | 0.08 | | 40.0 | 4.6 | 4.3 |
| 0.43 | 0.53 | | | | 0.04 | 20.1 | 3.0 | 3.0 |
| 0.47 | 0.43 | | | | 0.09 | 33.7 | 3.6 | 3.5 |
| 0.47 | 0.48 | | | | 0.05 | 5.9 | 2.6 | 1.6 |
| 0.50 | 0.40 | | | | 0.10 | 11.3 | 2.1 | 2.1 |

| COMPOSITION | | | | | | | R- | R- |
|---|---|---|---|---|---|---|---|---|
| Pt (at %) | W (at %) | Cu (at %) | Cr (at %) | Mo (at %) | Sn (at %) | ΔE (mV) | Act (0.7 V) | Act (0.8 V) |
| 0.22 | 0.52 | | 0.13 | 0.14 | | 18.0 | 5.7 | 4.4 |
| 0.24 | 0.53 | | 0.10 | 0.13 | | 30.0 | 6.4 | 5.8 |
| 0.25 | 0.56 | | 0.08 | 0.09 | | 25.3 | 5.4 | 5.0 |
| 0.26 | 0.60 | | 0.06 | 0.08 | | 27.4 | 5.6 | 5.4 |
| 0.27 | 0.45 | | 0.13 | 0.14 | | 18.4 | 4.7 | 3.5 |
| 0.28 | 0.63 | | 0.04 | 0.06 | | 29.5 | 5.5 | 5.4 |
| 0.29 | 0.48 | | 0.10 | 0.12 | | 30.4 | 5.6 | 4.6 |
| 0.32 | 0.50 | | 0.08 | 0.10 | | 38.9 | 6.2 | 5.4 |
| 0.34 | 0.39 | | 0.13 | 0.15 | | 11.5 | 3.5 | 2.2 |
| 0.35 | 0.51 | | 0.05 | 0.08 | | 47.2 | 6.4 | 6.4 |
| 0.37 | 0.40 | | 0.10 | 0.13 | | 26.8 | 4.5 | 3.2 |
| 0.37 | 0.53 | | 0.04 | 0.06 | | 52.3 | 7.1 | 6.8 |
| 0.39 | 0.42 | | 0.08 | 0.11 | | 38.5 | 5.0 | 4.5 |
| 0.40 | 0.46 | | 0.05 | 0.09 | | 34.7 | 4.5 | 4.2 |
| 0.41 | 0.50 | | 0.04 | 0.06 | | 29.8 | 4.3 | 3.7 |

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

What we claim is:

1. A fuel cell cathode catalyst composition consisting essentially of:
   a metal composition consisting essentially of platinum, tungsten and a third metal,
   wherein platinum is present in an atomic percentage ranging between about 20 percent and less than about 39 percent, tungsten is present in an atomic percentage ranging between about 30 percent and about 75 percent, and a third metal is present in an atomic percentage ranging between about 1 percent and about 40 percent; and
   wherein the third metal is at least one member selected from the group consisting of scandium, vanadium, chromium, manganese, iron, cobalt, copper, zinc, yttrium, niobium, molybdenum, cadmium, tin, hafnium, tantalum and rhenium.

2. The fuel cell cathode catalyst composition according to claim 1, wherein the metal composition further consists essentially of a fourth metal present in an atomic percentage ranging between about 1 percent and about 40 percent, and
   wherein the fourth metal is at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium, and
   wherein the third metal and the fourth metal are not the same metal.

3. The fuel cell cathode catalyst composition according to claim 2, wherein the metal composition further consists essentially of a fifth metal present in an atomic percentage ranging between about 1 percent and about 40 percent, and
   wherein the fifth metal is at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium, and
   wherein the third metal, the fourth metal and the fifth metal are not the same metal.

4. The fuel cell cathode catalyst composition according to claim 1, wherein the platinum is present in an atomic percentage ranging between about 20 percent and about 35 percent.

5. The fuel cell cathode catalyst composition according to claim 1, wherein the tungsten is present in an atomic percentage ranging between about 30 percent and about 65 percent.

6. The fuel cell cathode catalyst composition according to claim 1, wherein the third metal is at least one member selected from the group consisting of chromium, cobalt, copper, molybdenum and tin.

7. The fuel cell cathode catalyst composition according to claim 6, wherein tin is present in an atomic percentage ranging between about 1 percent and about 15 percent.

8. The fuel cell cathode catalyst composition according to claim 1, wherein structure of the metal composition comprises at least one member selected from the group consisting of alloys, mixed oxides, hydrous oxides, mixed hydrides, bronzes, and pervoskites.

9. The fuel cell cathode catalyst composition according to claim 1, wherein the electrocatalyst has activity for the oxygen reduction reaction at least about twice as active as a standard platinum only electrocatalyst.

10. The fuel cell cathode catalyst composition according to claim 2, wherein the electrocatalyst has activity for the oxygen reduction reaction at least about twice as active as a standard platinum only electrocatalyst.

11. The fuel cell cathode catalyst composition according to claim 3, wherein the electrocatalyst has activity for the oxygen reduction reaction at least about twice as active as a standard platinum only electrocatalyst.

12. A fuel cell assembly comprising:
a cathode,
a membrane, and
an anode;
wherein the cathode comprises a catalyst layer consisting essentially of platinum, tungsten, and a third metal,
wherein platinum is present in an atomic percentage ranging between about 20 percent and less than about 39 percent, tungsten is present in an atomic percentage ranging between about 30 percent and about 75 percent, and the third metal is present in an atomic percentage ranging between about 1 percent and about 40 percent, and
wherein the third metal is at least one member selected from the group consisting of scandium, vanadium, chromium, manganese, iron, cobalt, copper, zinc, yttrium, niobium, molybdenum, cadmium, tin, hafnium, tantalum and rhenium.

13. The fuel cell assembly according to claim 12, wherein the catalyst layer further consists essentially of a fourth metal present in an atomic percentage ranging between about 1 percent and about 40 percent, and
wherein the fourth metal is at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium, and
wherein the third metal and the fourth metal are not the same metal.

14. The fuel cell assembly according to claim 13, wherein the catalyst layer composition further consists essentially of a fifth metal present in an atomic percentage ranging between about 1 percent and about 40 percent, and
wherein the fifth metal is at least one member selected from the group consisting of scandium, titanium, vanadium, chromium, manganese, iron, cobalt, nickel, copper, zinc, yttrium, zirconium, niobium, molybdenum, cadmium, tin, hafnium, tantalum and rhenium, and
wherein the third metal, the fourth metal and the fifth metal are not the same metal.

15. The fuel cell assembly according to claim 12, wherein the cathode comprises a thin film electrocatalyst.

16. The fuel cell assembly according to claim 15, wherein the cathode comprises a supported nanoparticle-containing powder electrocatalyst.

17. The fuel cell assembly according to claim 12, wherein the cathode has activity for the oxygen reduction reaction at least about twice as active as a standard platinum only cathode.

* * * * *